(12) United States Patent
Gowda et al.

(10) Patent No.: US 10,204,881 B2
(45) Date of Patent: Feb. 12, 2019

(54) POWER OVERLAY STRUCTURE AND RECONSTITUTED SEMICONDUCTOR WAFER HAVING WIREBONDS

(71) Applicant: General Electric Company, Schenectady, NY (US)

(72) Inventors: Arun Virupaksha Gowda, Rexford, NY (US); Paul Alan McConnelee, Albany, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/472,912

(22) Filed: Mar. 29, 2017

(65) Prior Publication Data

US 2017/0200692 A1    Jul. 13, 2017

Related U.S. Application Data

(63) Continuation of application No. 14/512,562, filed on Oct. 13, 2014, now Pat. No. 9,613,843.

(51) Int. Cl.
*H01L 23/00* (2006.01)
*H01L 23/522* (2006.01)
(Continued)

(52) U.S. Cl.
CPC .......... *H01L 24/46* (2013.01); *H01L 21/6835* (2013.01); *H01L 21/76879* (2013.01);
(Continued)

(58) Field of Classification Search
CPC . H01L 21/6835; H01L 21/78; H01L 23/3164; H01L 23/525; H01L 23/5283; H01L 24/03; H01L 24/05; H01L 24/06; H01L 24/24; H01L 24/82; H01L 25/072; H01L 23/564; H01L 24/29; H01L 24/32;
(Continued)

(56) References Cited

U.S. PATENT DOCUMENTS 5,048,179 A    9/1991 Shindo et al.
5,637,922 A    6/1997 Fillion et al.
(Continued)

FOREIGN PATENT DOCUMENTS

DE    102007046021 A1    5/2008

OTHER PUBLICATIONS

Xu et al., "Growth of Intermetallic Compounds in Thermosonic Copper Wire Bonding on Aluminum Metallization," Journal of Electronic Materials, vol. 39, No. 1, Sep. 9, 2009, pp. 124-131.
(Continued)

*Primary Examiner* — Alexander Oscar Williams
(74) *Attorney, Agent, or Firm* — Ziolkowski Patent Solutions Group, SC

(57) ABSTRACT

A power overlay (POL) structure includes a power device having at least one upper contact pad disposed on an upper surface of the power device, and a POL interconnect layer having a dielectric layer coupled to the upper surface of the power device and a metallization layer having metal interconnects extending through vias formed through the dielectric layer and electrically coupled to the at least one upper contact pad of the power device. The POL structure also includes at least one copper wirebond directly coupled to the metallization layer.

28 Claims, 9 Drawing Sheets

(51) Int. Cl.
| | |
|---|---|
| *H01L 21/78* | (2006.01) |
| *H01L 25/00* | (2006.01) |
| *H01L 21/768* | (2006.01) |
| *H01L 21/683* | (2006.01) |
| *H01L 23/528* | (2006.01) |
| *H01L 25/07* | (2006.01) |
| *H01L 23/31* | (2006.01) |
| *H01L 23/525* | (2006.01) |

(52) U.S. Cl.
CPC .......... *H01L 21/78* (2013.01); *H01L 23/3164* (2013.01); *H01L 23/525* (2013.01); *H01L 23/528* (2013.01); *H01L 23/5226* (2013.01); *H01L 23/5283* (2013.01); *H01L 24/03* (2013.01); *H01L 24/05* (2013.01); *H01L 24/06* (2013.01); *H01L 24/24* (2013.01); *H01L 24/32* (2013.01); *H01L 24/73* (2013.01); *H01L 24/82* (2013.01); *H01L 24/85* (2013.01); *H01L 25/072* (2013.01); *H01L 25/50* (2013.01); *H01L 23/564* (2013.01); *H01L 24/29* (2013.01); *H01L 24/48* (2013.01); *H01L 24/49* (2013.01); *H01L 2224/03466* (2013.01); *H01L 2224/04042* (2013.01); *H01L 2224/05018* (2013.01); *H01L 2224/05093* (2013.01); *H01L 2224/05094* (2013.01); *H01L 2224/05124* (2013.01); *H01L 2224/05147* (2013.01); *H01L 2224/05553* (2013.01); *H01L 2224/05554* (2013.01); *H01L 2224/05624* (2013.01); *H01L 2224/05647* (2013.01); *H01L 2224/0603* (2013.01); *H01L 2224/24137* (2013.01); *H01L 2224/29101* (2013.01); *H01L 2224/32225* (2013.01); *H01L 2224/45015* (2013.01); *H01L 2224/45147* (2013.01); *H01L 2224/4847* (2013.01); *H01L 2224/48137* (2013.01); *H01L 2224/48847* (2013.01); *H01L 2224/4903* (2013.01); *H01L 2224/4911* (2013.01); *H01L 2224/73265* (2013.01); *H01L 2224/8203* (2013.01); *H01L 2224/83424* (2013.01); *H01L 2224/83447* (2013.01); *H01L 2924/00014* (2013.01); *H01L 2924/07025* (2013.01); *H01L 2924/1033* (2013.01); *H01L 2924/10253* (2013.01); *H01L 2924/10272* (2013.01); *H01L 2924/10329* (2013.01); *H01L 2924/1203* (2013.01); *H01L 2924/1301* (2013.01); *H01L 2924/1302* (2013.01); *H01L 2924/1304* (2013.01); *H01L 2924/1305* (2013.01); *H01L 2924/13023* (2013.01); *H01L 2924/13034* (2013.01); *H01L 2924/13055* (2013.01); *H01L 2924/13091* (2013.01)

(58) Field of Classification Search
CPC ... H01L 24/49; H01L 23/528; H01L 23/5226; H01L 24/73; H01L 21/76879; H01L 24/85; H01L 23/00; H01L 23/522; H01L 21/768; H01L 21/683; H01L 25/07
USPC ....... 257/774, 730, 712–723, 777, 686, 685, 257/773
See application file for complete search history.

(56) References Cited

U.S. PATENT DOCUMENTS

| | | | |
|---|---|---|---|
| 7,319,196 B2 | 1/2008 | LeFranc et al. | |
| 7,839,642 B2 | 11/2010 | Martin | |
| 8,040,682 B2 | 10/2011 | Shimoda | |
| 8,164,176 B2 | 4/2012 | Siepe et al. | |
| 8,240,032 B2 | 8/2012 | Iihola et al. | |
| 8,269,355 B2 | 9/2012 | Pruitt | |
| 8,334,593 B2 | 12/2012 | McConnelee et al. | |
| 8,405,992 B2 | 3/2013 | Yesin et al. | |
| 9,385,009 B2* | 7/2016 | Lin | H01L 21/561 |
| 9,613,843 B2* | 4/2017 | Gowda | H01L 25/072 |
| 2005/0051889 A1 | 3/2005 | Wood et al. | |
| 2005/0106851 A1 | 5/2005 | Test et al. | |
| 2006/0108684 A1 | 5/2006 | Stevanovic et al. | |
| 2008/0190748 A1 | 8/2008 | Arthur et al. | |
| 2009/0134503 A1 | 5/2009 | Feng et al. | |
| 2009/0146282 A1* | 6/2009 | Tay | H01L 21/6835 257/686 |
| 2009/0152725 A1 | 6/2009 | Dalal et al. | |
| 2010/0230800 A1 | 9/2010 | Beaupre et al. | |
| 2011/0244636 A1 | 10/2011 | Kondo | |
| 2011/0266665 A1 | 11/2011 | Gowda et al. | |
| 2012/0273932 A1 | 11/2012 | Mao et al. | |
| 2013/0043571 A1 | 2/2013 | Gowda et al. | |
| 2013/0062630 A1 | 3/2013 | Gowda et al. | |
| 2013/0154099 A1 | 6/2013 | Hunter et al. | |
| 2013/0154108 A1* | 6/2013 | Lin | H01L 23/5389 257/774 |
| 2013/0154110 A1 | 6/2013 | Gowda | |
| 2013/0200528 A1* | 8/2013 | Lin | H01L 21/6836 257/774 |
| 2013/0256858 A1 | 10/2013 | Komposch et al. | |
| 2014/0001615 A1* | 1/2014 | Otremba | H01L 23/3135 257/676 |
| 2014/0133104 A1 | 5/2014 | Delgado et al. | |
| 2014/0167248 A1 | 6/2014 | Delgado et al. | |
| 2014/0264799 A1 | 9/2014 | Gowda et al. | |
| 2015/0084206 A1* | 3/2015 | Lin | H01L 23/3135 257/774 |
| 2015/0255418 A1 | 9/2015 | Gowda et al. | |
| 2015/0364394 A1* | 12/2015 | Lin | H01L 24/03 257/734 |
| 2015/0364430 A1* | 12/2015 | Lin | H01L 23/562 257/773 |
| 2016/0013148 A1* | 1/2016 | Lin | H01L 23/552 257/773 |
| 2016/0118333 A1* | 4/2016 | Lin | H01L 24/97 257/773 |
| 2016/0276237 A1* | 9/2016 | Lin | H01L 23/49816 |
| 2017/0207160 A1* | 7/2017 | Gowda | H01L 23/49838 |

OTHER PUBLICATIONS

Nguyen et al.,"Optimization of copper Wire Bonding on Al-Cu Metallization," IEEE Transactions on Components, Packaging, and Manufacturing Technology, Part A, vol. 18, No. 2, Jun. 1995, pp. 423-429.

Seng, "Characterization of Intermetallic Growth for Gold Bonding and Copper Bonding on Aluminum Metallization in Power Transistor," 2007 9th Electronics Packaging Technology Conference, Dec. 2007, pp. 731-736.

Breach, "What is the future of bonding wire? Will copper entirely replace gold?," Gold Bulletin, vol. 43, No. 3, 2010, pp. 150-168.

England et al.,"Reliability of Cu Wire Bonding to Al Metallization," 2007 Electronic Components and Technology Conference, pp. 1604-1613.

Schulz-Harder "Advantages and new development of direct bonded copper substrates", Microelectronics Reliability, vol. No. 43, Issue No. 3, pp. 359-365, Mar. 2003.

A European Search Report and Opinion issued in connection with EP Application No. 5189400.3 dated Jan. 12, 2016.

* cited by examiner

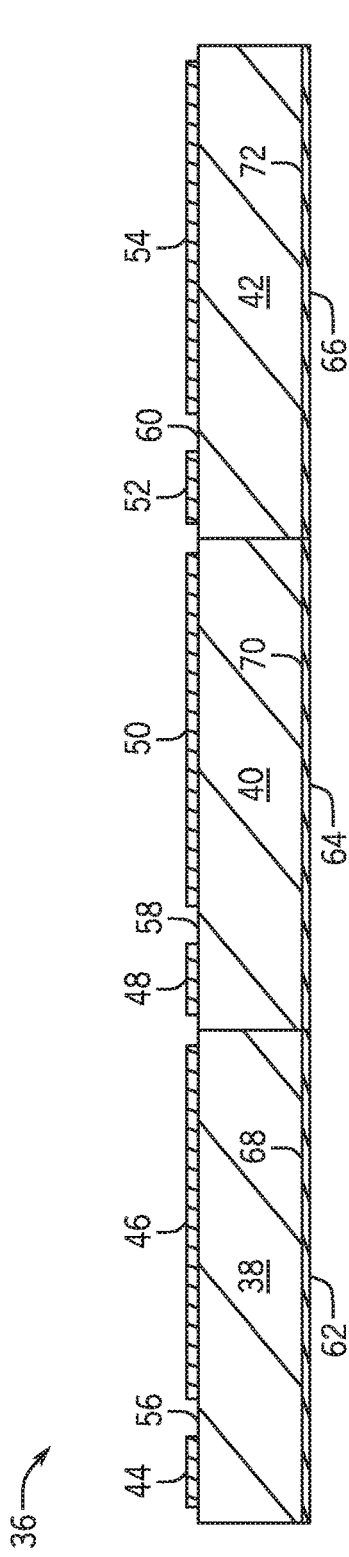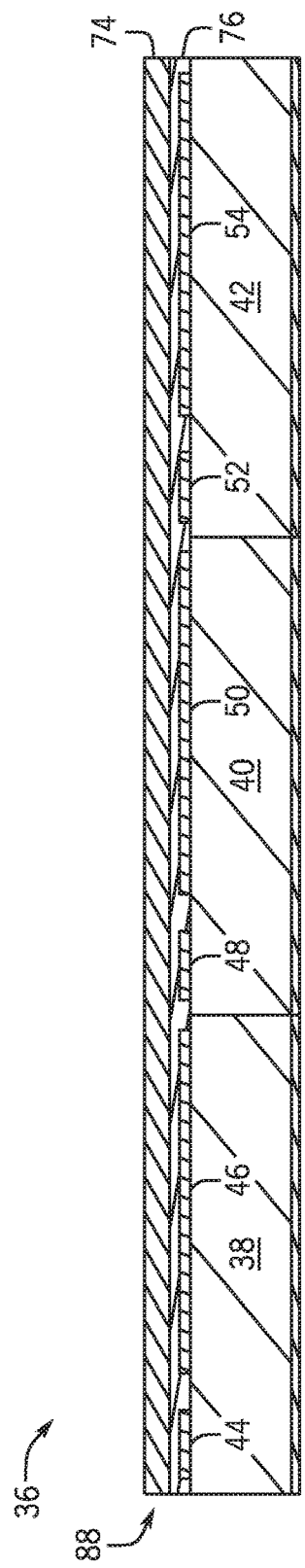

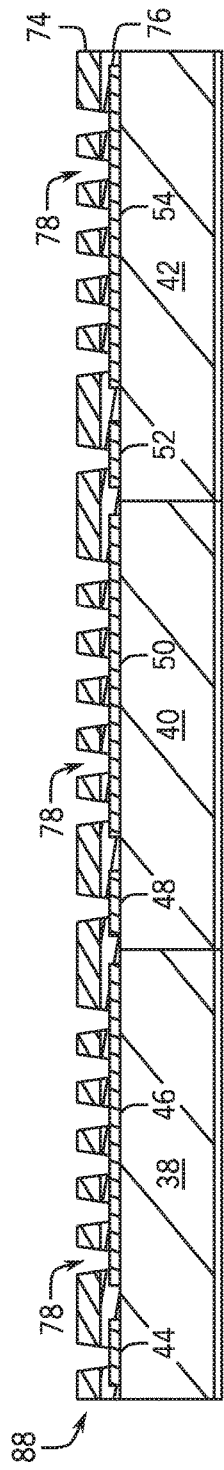
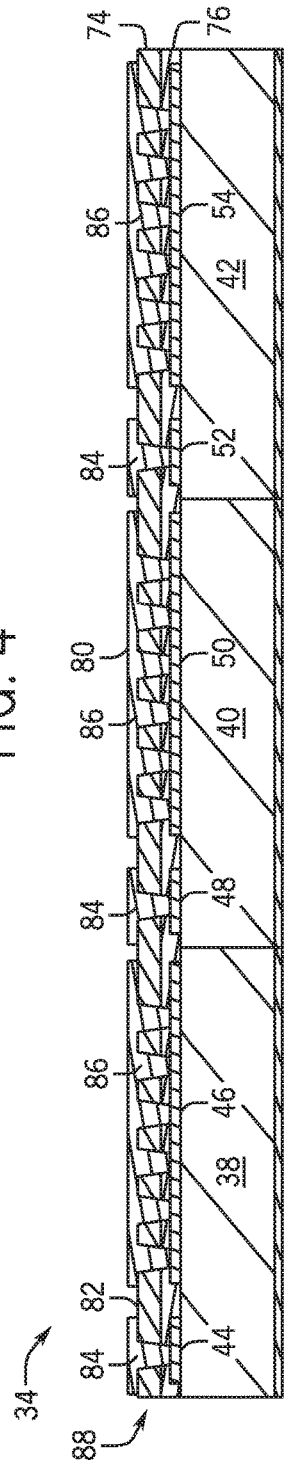
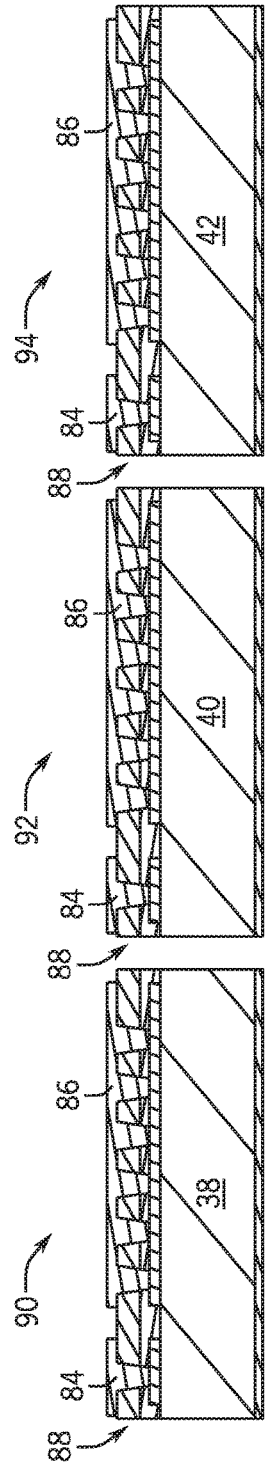
FIG. 4
FIG. 5
FIG. 6

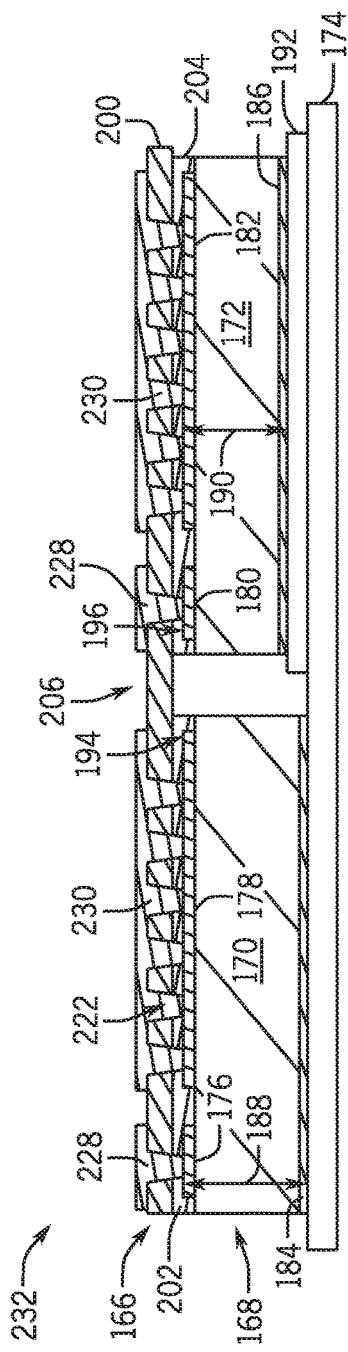
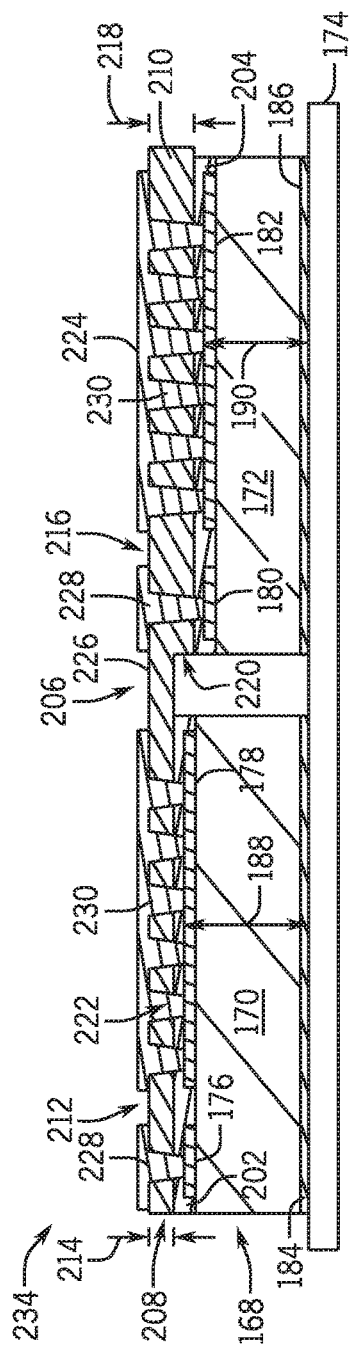
FIG. 12
FIG. 13

POWER OVERLAY STRUCTURE AND RECONSTITUTED SEMICONDUCTOR WAFER HAVING WIREBONDS

CROSS REFERENCE TO RELATED APPLICATION

The present application is a continuation of, and claims priority to, U.S. patent application Ser. No. 14/512,562, filed Oct. 13, 2014, issued as U.S. Pat. No. 9,613,843, the disclosure of which is incorporated herein by reference in its entirety.

BACKGROUND OF THE INVENTION

Embodiments of the invention relate generally to structures and methods for wirebonding of power devices and, more particularly, to a power overlay (POL) structure that enables copper wirebonding of power devices regardless of the material type of the contact pads of the power device.

Power semiconductor devices are semiconductor devices used as switches or rectifiers in power electronic circuits, such as switched mode power supplies, for example. In use, power semiconductor devices are typically mounted to an external circuit by way of a packaging structure, with the packaging structure providing an electrical connection to the external circuit and also providing a way to remove the heat generated by the devices and protect the devices from the external environment. Power semiconductor devices are provided with a number of input/output (I/O) interconnections to electrically connect the device to an external circuit. These I/O connections may be provided in the form of solder balls, plated bumps, or wirebond connections. In the case of wirebond packaging, wirebonds are provided that connect bond pads or contact pads provided on the power semiconductor device to a corresponding pad or conductive element at the next level of packaging, which may be a circuit board or leadframe. Most existing power device packaging structures use a combination of wirebonds and a substrate (e.g., a direct bonded copper (DBC) substrate) to provide I/O interconnections to both sides of a respective semiconductor device. The packaging structures may be leaded (leadframe, etc.) or provided with bolted terminals for providing electrical connectivity to the packaging structure. The wirebonds form electrical connections from one surface of the packaging structure to package pins, which then interface to the external circuit, and the DBC substrate electrically couples the other surface of the packaging structure to the external circuit.

FIG. 1 depicts a wirebonded power package structure 10, according to known prior art, having a semiconductor device 12 with a gate contact pad 14 and an emitter contact pad 16 coupled to an upper surface 18 of semiconductor device 12. As shown, wirebonds 20, 22, 24 are bonded directly to the contact pads 14, 16 of the semiconductor device 12. In order to form reliable connections between the wirebonds 20, 22, 24 and the upper contact pads 14, 16 of the semiconductor device 12, the material of the wirebonds 20, 22, 24 is typically selected to match the metallization of the upper contact pads 14, 16.

A collector pad 26, often in the form of a nickel-gold metallization or a nickel-silver metallization, is formed on a lower surface 28 of semiconductor device 12. A solder 30 or sintered silver die attach material is used to couple the semiconductor device 12 to a DBC or direct bond aluminum (DBA) substrate 32.

Because power devices are typically manufactured with aluminum contact pads, the corresponding wirebonds are likewise formed of aluminum or an aluminum alloy in order to create a reliable electrical connection to the power device. Currently, there is a trend in the industry toward copper wirebonds, which provide lower electrical resistance, which leads to lower losses and higher efficiencies. However, copper wirebonds do not form reliable electrical connections to the aluminum metallization of the contact pads.

While copper contact pads could be incorporated into the power device at the time of manufacture, incorporating copper into the power device fabrication process is non-trivial and adds significant development cost and time. Also, manufacturers typically provide a single type of metallization material on all of the power devices that they manufacture. Given that a power module may incorporate power devices from multiple manufacturers, forming reliable wirebonds on those power devices is difficult because the various power devices within the given module could include dissimilar metallization materials.

Even where a power device is provided with copper metallization, coupling copper wirebonds to the copper metallization poses difficulties. For example, attaching a copper wirebond, especially a heavy gauge copper wirebond capable of withstanding high current transients, to a metallization or contact pad applies a greater amount of stress to the power device than a thinner gauge or aluminum wirebond. This is because copper to copper wirebonding requires higher energy for bonding due to its material properties compared to aluminum to aluminum wirebonding. Due to these higher energies, the wirebonding process can damage the power device.

Another issue with copper-to-copper wirebonding is the constriction of current as it flows from the contact pads of the power device to the wirebonds. The metallization layer of a contact pad on the power device is thin (e.g., a few microns) and the current must travel through this thin metallization until it encounters a wirebond and then flows through it. Wirebonds can be placed only at certain intervals due to equipment constraints, hence each power device will have only a handful wirebonds distributed across the contact pad. While providing a number of wirebonds for each contact pad helps in distributing the current flow, the resistance in the interconnect structure still results in inherent losses.

While prior attempts have been made to mitigate the above-described problems associated with copper-to-copper wirebonding, such as by optimizing the copper material properties of the contact pads and adjusting the thickness of the copper pads, there is room for further improvement in the field.

Therefore, it would be desirable to provide a POL structure that allows for the use of copper wirebonds without changing the metallization of the contact pads of the power device to copper. It would also be desirable to have a method for fabricating an I/O interconnection in the form of a wirebond that reduces device damage due to the applied stresses during the wirebonding process, thereby increasing process yield, and that provides for efficient current distribution from the power device to the wirebonds.

BRIEF DESCRIPTION OF THE INVENTION

In accordance with one aspect of the invention, a power overlay (POL) structure includes a power device having at least one upper contact pad disposed on an upper surface of the power device, and a POL interconnect layer having a dielectric layer coupled to the upper surface of the power device and a metallization layer having metal interconnects extending through vias formed through the dielectric layer and electrically coupled to the at least one upper contact pad of the power device. The POL structure also includes at least one copper wirebond directly coupled to the metallization layer.

In accordance with another aspect of the invention, a method of manufacturing a POL structure includes providing a wafer comprising a plurality of semiconductor devices, coupling a dielectric layer to an upper surface of the each of the plurality of semiconductor devices, forming a plurality of vias through the dielectric layer to expose at least one contact pad of the plurality of semiconductor devices, and forming a metallization layer on an upper surface f the dielectric layer, the metallization layer having metal interconnects that extend through the plurality of vias and electrically couple with the at least one contact pad of the plurality of semiconductor devices. The method further includes coupling at least one wirebond to a top surface of the metallization layer.

In accordance with yet another aspect of the invention, a POL assembly includes a first semiconductor device, a second semiconductor device, and a POL interconnect assembly having a polyimide film adhesively coupled to upper contact pads of the first and second semiconductor devices and a metallization path formed on the polyimide film, the metallization path comprising a plurality of metal interconnects extending through vias formed through the polyimide film and electrically coupled to the upper contact pads of the first and second semiconductor devices. The POL assembly also includes a plurality of copper wirebonds directly coupled to the metallization path, wherein a first wirebond of the plurality of copper wirebonds is electrically coupled to an upper contact pad of the first semiconductor device, and wherein a second wirebond of the plurality of copper wirebonds is electrically coupled to an upper contact pad of the second semiconductor device.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIGS. 2-6 are schematic cross-sectional side views during various stages of manufacturing a power overlay (POL) structure in accordance with an embodiment of the invention.

FIG. 12 is a schematic cross-sectional side view showing a reconstituted wafer incorporating POL structures, according to an embodiment of the invention.

FIG. 13 is a schematic cross-sectional side view showing a reconstituted wafer incorporating POL structures, according to another embodiment of the invention.

DETAILED DESCRIPTION

Figure 1:
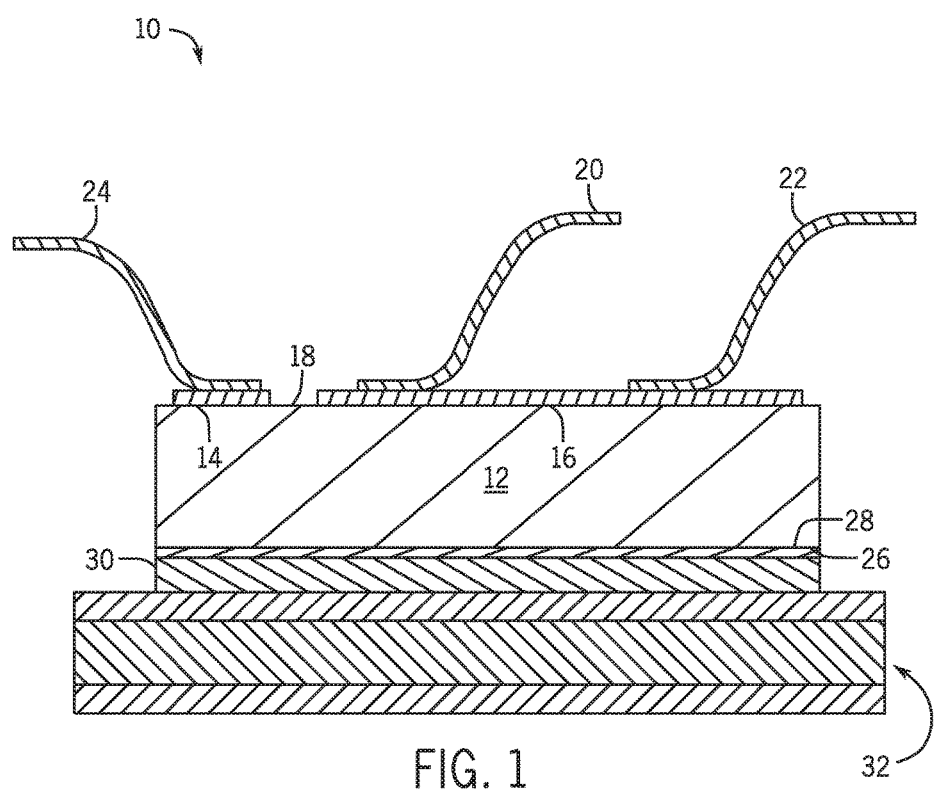
FIG. 1 is a schematic cross-sectional side view of a wirebonded power package structure, according to known prior art.

Embodiments of the present invention provide for a power overlay (POL) structure including a POL interconnect layer, as well as a method of forming such a POL structure. As used herein, the term "POL" describes a structure that enables copper wirebonding of power devices regardless of the material type of the contact pads of the power device. The POL interconnect layer allows for the reliable connection of copper wirebonds to the POL structure regardless of the material of the gate and emitter pads. In addition, the POL interconnect layer is designed to function as a stress buffer that reduces damage to the power device during the process of attaching the wirebonds to the device contact pads. By providing parallel paths for the current to flow through the metallization of the power device before it enters the wirebonds, the POL structure disclosed herein has reduced interconnect resistance and losses as compared to prior art wirebonded power devices.

FIGS. 2-6 depict a technique for manufacturing a POL structure 34, according to an embodiment of the invention, with each of FIGS. 2-6 illustrating a cross-section of the POL structure 34 during the build-up process. Referring first to FIG. 2, a wafer 36 is shown. According to one embodiment, wafer 36 includes a plurality of semiconductor dies or semiconductor devices 38, 40, 42. Semiconductor devices 38, 40, 42 are power devices such as insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), Gallium Arsenide (GaAs), as non-limiting examples. While FIG. 2 shows wafer 36 having three semiconductor devices 38, 40, 42, it is contemplated that wafer 36 may include more or less than three semiconductor devices.

Each semiconductor device 38, 40, 42 may include one or more upper contact pads 44, 46, 48, 50, 52, 54 disposed on an upper surface 56, 58, 60 of its respective semiconductor device 38, 40, 42. These upper contact pads 44-54 provide conductive routes to internal contacts within each semiconductor device 38, 40, 42. In the illustrated embodiment, each semiconductor device 38, 40, 42 includes a pair of upper contact pads coupled to corresponding emitter and/or gate or anode regions of the semiconductor device 38, 40, 42. In one embodiment, semiconductor device 38, 40, 42 are IGBTs having contact pads 44-54 coupled to a respective emitter region and gate region of the respective semiconductor device 38, 40, 42. Specifically, semiconductor device 38 includes gate pad 44 and emitter pad 46, semiconductor device 40 includes gate pad 48 and emitter pad 50, and semiconductor device 42 includes gate pad 52 and emitter pad 54. It is contemplated that semiconductor die 38, 40, 42 may be provided having a differing number of contact pads and/or differing combinations of contact pads than those described above. As one non-limiting example, semiconductor die 38 may be provided having a pair of emitter pads. In one embodiment contact pads 44, 46, 48 comprise aluminum. However, it is contemplated that contact pads 44, 46, 48 may be formed from other types of electrically conductive materials, such as, for example, copper. Each semiconductor device 38, 40, 42 also includes at least one lower contact pad or collector pad 62, 64, 66 that is disposed on a lower surface 68, 70, 72 of its respective semiconductor device 38, 40, 42.

As shown in FIG. 3, fabrication of POL structure 34 begins with coupling a dielectric layer 74 to the upper surfaces 56, 58, 60 of semiconductor devices 38, 40, 42 using an adhesive layer 76. Dielectric layer 74 may be in the form of a stable, non-flowing lamination or a film, according to various embodiments, and may be formed of one of a plurality of dielectric materials, such as Kapton®, Ultem®, polytetrafluoroethylene (PTFE), Upilex®, polysulfone materials (e.g., Udel®, Radel®), or another polymer film, such as a liquid crystal polymer (LCP) or a polyimide material. In one embodiment, dielectric layer 74 may be stretched on a frame (not shown) to control distortion during the fabrication process. The adhesive layer 76 may be applied to dielectric layer 74 using a spin coating technique after which wafer 36 is placed into adhesive layer 76 using conventional pick and place equipment and methods.

While FIG. 3 depicts POL structure 34 has having separate dielectric and adhesive layers 74, 76, it is contemplated that in an alternative embodiment, layers 74, 76 may be replaced by a single dielectric layer having adhesive properties. Non-limiting examples of such an adhesive dielectric layer include a spin-on dielectric such as a polymide or polybenzoxzaole (PBO).

Referring now to FIG. 4, a plurality of vias 78 are formed through dielectric layer 74 and adhesive layer 76 to expose contact pads 44, 46, 48 of each semiconductor device 38, 40, 42. Vias 78 may be formed by, but not limited to, laser drilling or dry etching, for example. As shown in FIG. 5, metallization path or metallization layer 80 is formed on an upper surface 82 of dielectric layer 74 in a next step of the fabrication process. Metallization layer 80 includes a first portion of metal interconnects 84 that extend through vias 78 and are electrically coupled to contact pads 44, 48, 52 of semiconductor devices 38, 40, 42, and a second portion of metal interconnects 86 that extend through vias 78 and are electrically coupled to contact pads 46, 50, 54 of semiconductor devices 38, 40, 42. In a preferred embodiment, metallization paths 80 comprise a layer of copper. However, it is contemplated that the manufacturing technique may be extended to the use of other electrically conducting materials for metallization paths 80. In one embodiment, metallization paths 80 may be formed using a sputtering and plating technique, followed by a lithography process. Together, metallization paths 80, vias 78, dielectric layer 74, and adhesive layer 76 form a POL interconnect layer 88.

Referring now to FIG. 6, POL structure 34 is sawn or singulated into individual POL structures 90, 92, 94. Each POL structure 90, 92, 94 includes a respective semiconductor device 38, 40, 42 having a portion of POL interconnect layer 88 bonded thereto. As wafer 36 may include more or less than three semiconductor devices 38, 40, 42, it is also contemplated that POL structure 34 may be separated into more or less than three POL structures 90, 92, 94.

Figure 7:
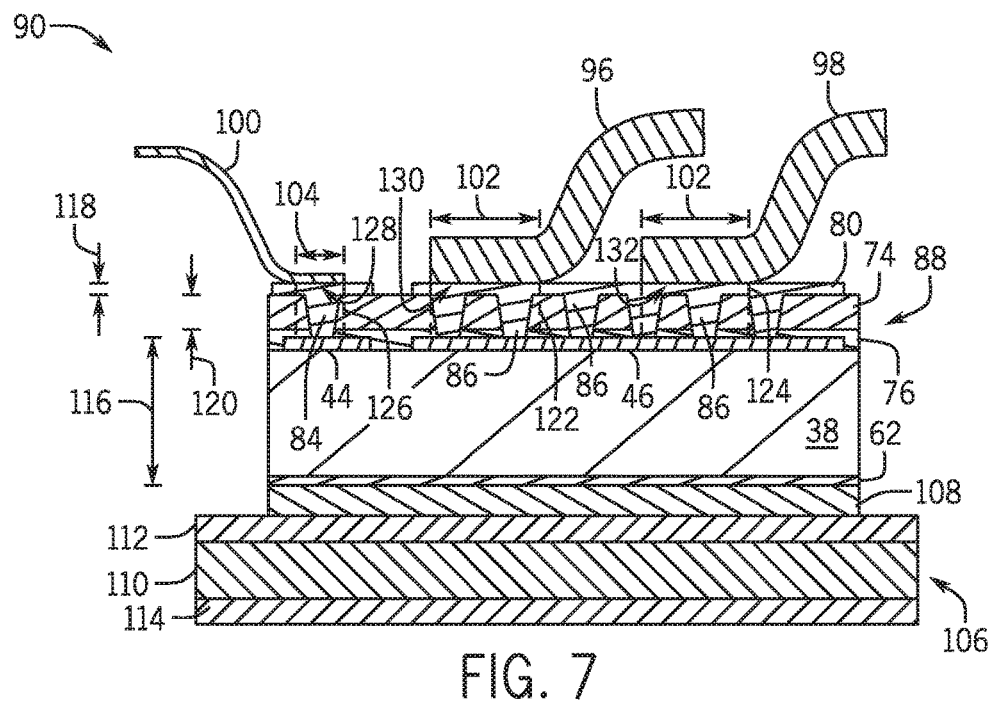
FIG. 7 is a schematic cross-sectional side view of one of the POL structures of FIG. 6 incorporating wirebonds, according to another embodiment of the invention.

Now referring to FIG. 7, after POL structure 34 has been sawn or singulated into individual POL structures 90, 92, 94, one or more wirebonds are coupled to metallization path 80 in a next step of the manufacturing technique. In the illustrated embodiment, wirebonds 96, 98 are coupled to metal interconnects 86 of metallization path 80 and wirebond 100 is bonded to metal interconnects 84 by a wirebonding process. However, it is contemplated that alternative embodiments may incorporate more or less than two wirebonds bonded to the second portion of metal interconnects 86 and/or more than one wirebond 100 bonded to the first portion of metal interconnects 84. According to an exemplary embodiment of the invention, wirebonds 96, 98, 100 are copper.

In one embodiment, wirebonds 96, 98 are provided having a heavier gauge or greater diameter than wirebond 100, thereby permitting wirebonds 96, 98 to handle a larger amount of electrical current passing through contact pad 46 with a lower electrical resistance. As one non-limiting example, wirebonds 96, 98 may be provided as "heavy" copper wirebonds having a diameter of approximately 10-20 mils. Meanwhile, wirebond 100 may be provided as a "thin" copper wirebond relative to wirebonds 96, 98, having a diameter ranging from approximately 3-10 mils, for example. In such a non-limiting embodiment of the invention, the surface contact area 102 between heavy wirebonds 96, 98 and metallization path 80 may be approximately 50 mils by 80 mils. On the other hand, the surface contact area 104 between thin gauge wirebond 100 and metallization path 80 may be in the range of approximately 10-15 mils by 20 mils, for example. In an exemplary embodiment of the invention, the width of surface contact areas 102, 104 is two to three times the diameter of the respective wirebond 96, 98, 100, and the length of surface contact areas 102, 104 is four to five times the diameter of the respective wirebond 96, 98, 100. However, one skilled in the art will recognize that embodiments of the invention are not limited to a particular wire gauge used for wirebonds 96, 98, 100 and that the diameter or gauge of wirebonds 96, 98, 100 may be varied as desired for a given application and the corresponding surface contact area will change accordingly.

A multi-layer substrate 106 is thermally and electrically coupled to contact pad 62 of the semiconductor device 38 via a solder 108. In one embodiment, multi-layer substrate 106 is a prefabricated direct bond copper (DBC) component that includes a non-organic ceramic substrate 110 such as, for example, alumina, aluminum nitride, silicon nitride, etc., with upper and lower sheets of copper 112, 114 bonded to both sides thereof via a direct bond copper interface or braze layer. In another embodiment of the invention, it is contemplated multi-layer substrate 106 may be a direct bond aluminum (DBA) substrate having upper and lower aluminum sheets 112, 114.

While FIG. 7 and subsequent figures depict a multi-layer substrate 106 thermally and electrically coupled to contact pad 62, it is contemplated that alternative embodiments may include a single layer substrate such as, for example, a leadframe instead of multi-layer substrate 106.

As shown in FIG. 7, semiconductor device 38 is provided having a thickness 116 of approximately 50-500 microns. In addition, the thickness 118 of metallization path 80 may be in the range of approximately 5-150 microns, while the thickness 120 of dielectric layer 74 may be approximately 0.5-2 mils.

In the embodiment illustrated in FIG. 7, each wirebond 96, 98, 100 is coupled to a respective portion 122, 124, 126 of POL interconnect layer 88 that includes at least one metal interconnect 84, 86 or a portion thereof. Specifically, the portion 126 of POL interconnect layer 88 beneath the contact surface 128 of wirebond 100 includes one metal interconnect 84, and the portions 122, 124 of POL interconnect layer 88 beneath respective contact surfaces 130, 132 of wirebonds 96, 98 each include portions of at least two metal interconnects 86. Metal interconnects 86 thus form multiple parallel paths for current to travel from semiconductor device 38 into wirebonds 96, 98.

Figure 8:
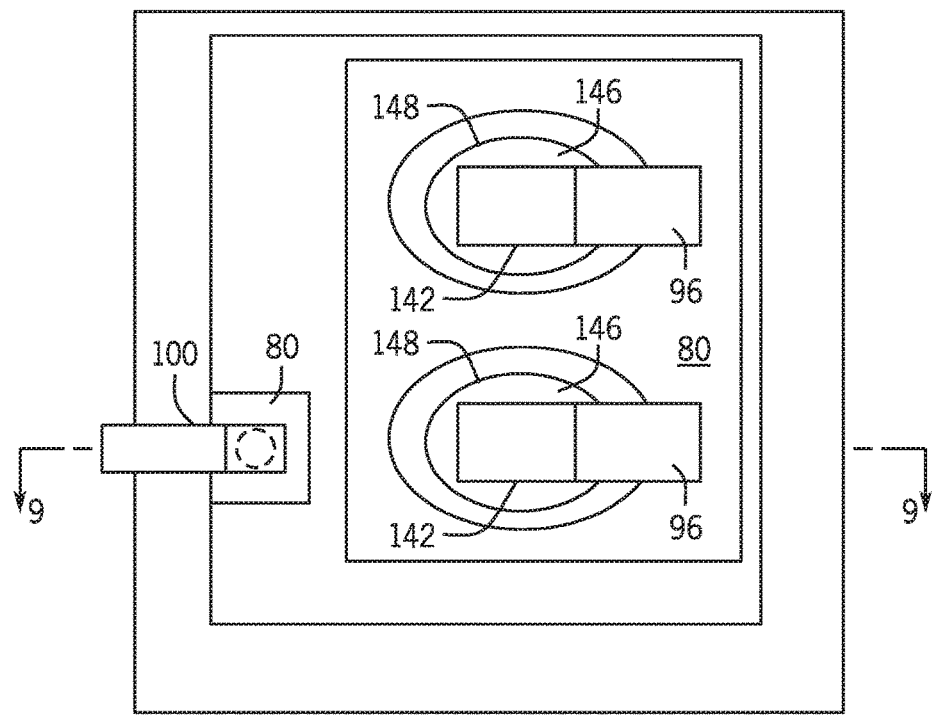
FIGS. 8 and 9 are schematic top and cross-sectional side views of a POL structure with wirebonds, according to an alternative embodiment of the invention.
Figure 9:
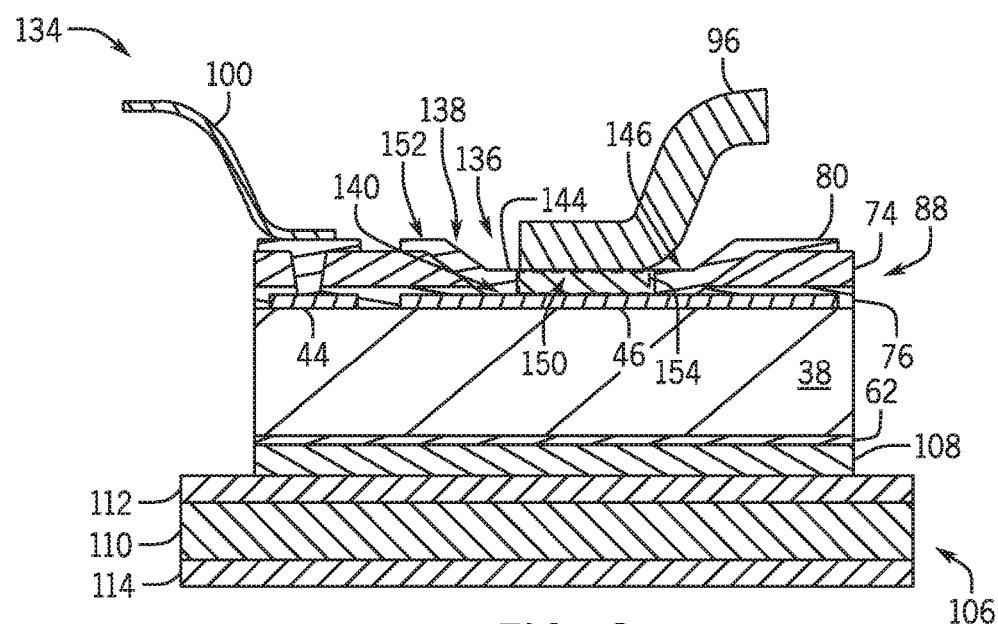

FIGS. 8 and 9 illustrate the positioning of wirebond 96 within a POL structure 134 according to another embodiment of the invention. Elements and components common to POL structure 134 and POL structure 34 are referred to herein with similar part numbers as appropriate. As shown, wirebond 96 is positioned within a depression or well 136 formed within dielectric layer 74. The well 136 is formed by creating a large via 138 within adhesive layer 76 and dielectric layer 74 that exposes a portion of contact pad 46 having a surface area 140 greater than a surface area surface area 142 of the wirebond 96. When metallization path 80 is created, the metallization path 80 extends into via 138 and forms a metal interconnect 144 having a relatively planar upper contact surface 146. A surface area 148 of the upper contact surface 146 is greater than a corresponding surface area 142 of wirebond 96. Thus, the contact surface 150 of wirebond 96 is positioned below the top surface 152 of metallization path 80. In this embodiment, metallization path 80 is in direct contact with contact pad 46, without any portion of adhesive layer 76 or dielectric layer 74 positioned therebetween, as illustrated in FIG. 9. Thus, a portion 154 of POL structure 134 beneath the contact surface 150 of wirebond 96 is substantially free of any portion of the dielectric layer 74 or the adhesive layer 76. In this embodiment, the increased surface area of metallization path 80 and contact pad 46 decreases the resistance in the current path between contact pad 46 and wirebond 96.

In another embodiment, it is contemplated that, when metallization path 80 is created by extending into via 138 and forming metal interconnects 144, the planar upper contact surface 146 and the surface 152 of metallization path 80 are coplanar. As such, wirebond 96 is positioned at the same height as the top surface 152 of metallization path 80. In this embodiment, portion 154 of POL structure 134 beneath contact surface 150 of wirebond 96 is still substantially free of any portion of the dielectric layer 74 or the adhesive layer 76.

Figure 10:
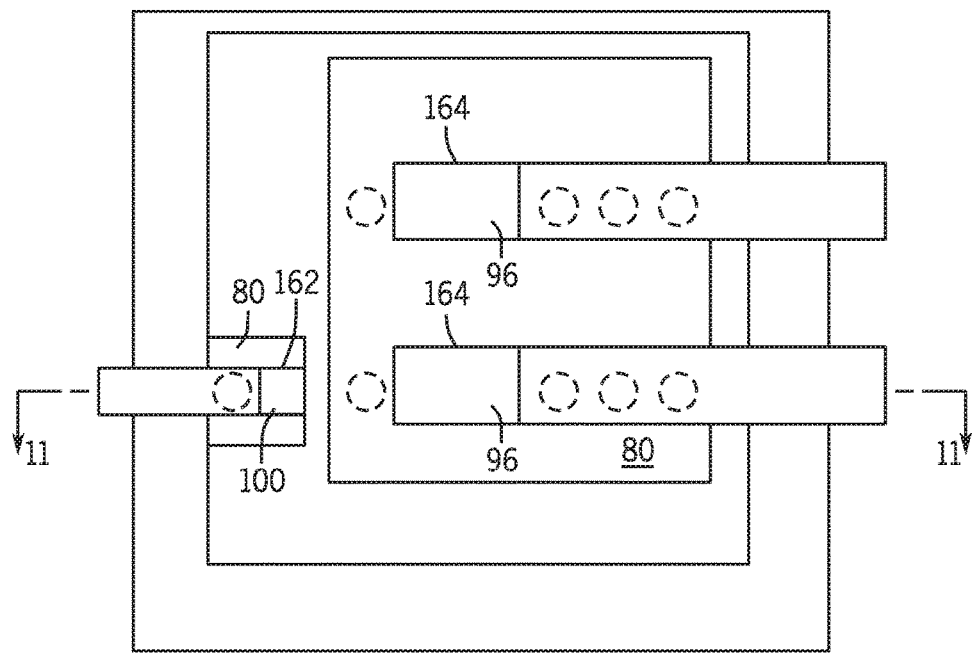
FIGS. 10 and 11 are schematic top and cross-sectional side views of a POL structure with wirebonds, according to yet another embodiment of the invention.
Figure 11:
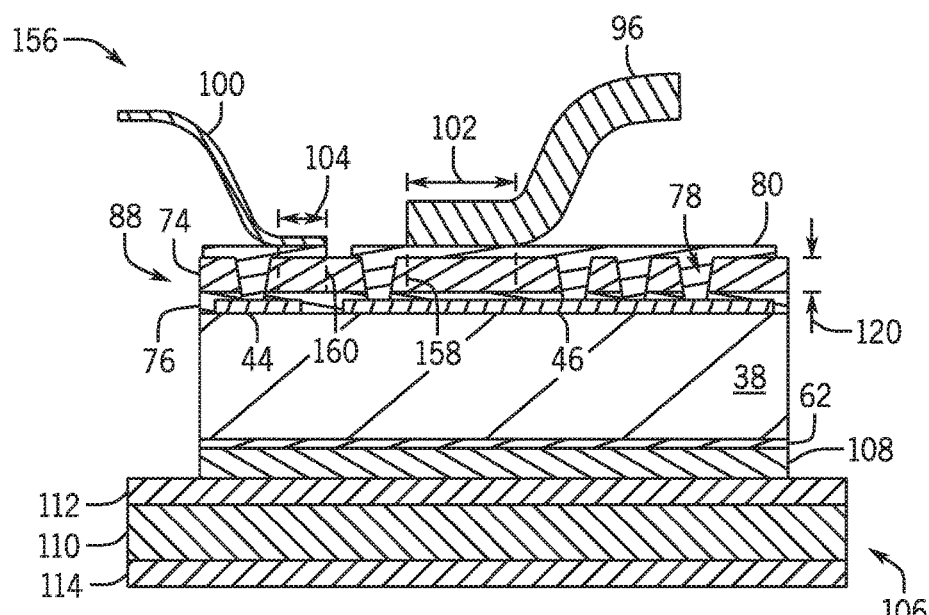

Referring now to FIGS. 10 and 11, a POL structure 156 is illustrated according to an alternative embodiment of the invention. Again, common elements to POL structure 156 and POL structure 34 are referred to with similar reference numbers as appropriate. As shown, wirebonds 96, 100 are coupled to metallization path 80 at in a portion of POL structure 156 that is free of vias 78. Thus, in this embodiment, none of vias 78 are located within the portions 158, 160 of the dielectric layer 74 positioned directly underneath the respective contact locations 162, 164 of the wirebonds 96, 100. The thickness 120 of the dielectric layer 74 is substantially uniform in portion of POL structure 156 beneath wirebonds 96, 100 and acts as a stress buffer to reduce potential damage to semiconductor device 38 during the wirebonding process.

While wirebonds 96, 98, 100 and DBC substrate 106 are described above as being coupled to an individual semiconductor device 38 in FIGS. 7-11, it is contemplated that DBC substrate 106 and/or wirebonds 96, 98, 100 may be applied to respective semiconductor devices 38, 40, 42 at the wafer level (i.e., prior to singulation).

In an alternative embodiment, a POL interconnect layer 166 may be simultaneously formed on multiple individual semiconductor devices provided within a package or reconstituted wafer. Referring now to FIG. 12, a reconstituted wafer 168 is shown having a plurality of semiconductor devices 170, 172, coupled to a removable support structure 174. One having ordinary skill in the art would recognize that reconstituted wafer 168 may include more than two semiconductor devices 170, 172 in alternative embodiments. Similar to semiconductor devices 38, 40, 42 of FIGS. 2-6, semiconductor devices 170, 172, include a plurality of upper contact pads 176, 178, 180, 182, and at least one lower contact pad or collector pad 184, 186. Upper contact pads 176-182 may comprise various combinations of emitter and/or gate pads. In a preferred embodiment upper contact pads 176-182 are aluminum or copper. However, it is contemplated that upper contact pads 176-182 may comprise alternative metallization materials.

As shown in FIG. 12 semiconductor devices 170, 172 are of varying thicknesses 188, 190, with the thickness 188 of semiconductor device 170 greater than the thickness 190 of semiconductor device 172. To account for this variance in thickness, a shim 192 may be positioned between a thinner semiconductor device and the removable support structure 174 such that an upper surface 194 of the contact pads 176, 178 of semiconductor device 170 are substantially coplanar with an upper surface 196 of the contact pads 180, 182 of semiconductor device 172 within the wafer 168.

Once upper surfaces 194-196 of semiconductor devices 170, 172 are positioned to be substantially coplanar, POL interconnect layer 166 is formed atop semiconductor devices 170, 172 in a similar manner as described with respect to FIGS. 3-5. In applying dielectric layer 200 to semiconductor devices 170, 172, it is contemplated that a single adhesive layer may be spin coated onto dielectric layer 200 in a similar manner as described with respect to dielectric layer 74 (FIG. 3), or individual layers of adhesive 202, 204 may be formed atop each semiconductor device 170, 172 as shown in FIG. 11. In either case, dielectric layer 200 is positioned to span a gap 206 between the adjacent semiconductor devices 170, 172. Dielectric layer 200 may be in the form of a lamination or a film, according to various embodiments, and may be formed of one of a plurality of dielectric materials, similar to dielectric layer 74.

In an alternative embodiment of the invention, the semiconductor devices 170, 172 are coupled to dielectric layer 200 via respective adhesive layers 202, 204 (or a single adhesive layer). Here, the semiconductor devices 170, 172 are coupled to the dielectric layer 200 by placing them on the adhesive layers 202, 204, as opposed to applying the dielectric layer 200 to the semiconductor devices 170, 172. As such, the removable support structure 174 may be omitted.

In another embodiment of the invention, illustrated in FIG. 13, a POL interconnect layer 208 may be formed having a dielectric layer 210 constructed to compensate for the differing thicknesses 188, 190 of semiconductor devices 170, 172. As shown, a first portion 212 of dielectric layer 210 that is aligned with semiconductor device 170 has a first thickness 214 and a second portion 216 of dielectric layer 210 that is aligned with semiconductor device 172 has a second thickness 218. A step 220 is positioned at the transition between first portion 212 and second portion 216. In yet another embodiment of the invention, the differing heights of semiconductor devices 170, 172 may be compensated by varying thicknesses of adhesive layers 202, 204.

Referring to FIGS. 12 and 13 together, to complete each POL interconnect layer 166, a plurality of vias 222 are formed through dielectric layer 200 and adhesive layers 202, 204, to expose contact pads 176, 178, 180, 182. Next, a metallization path 224 is formed on an upper surface 226 of dielectric layer 200. Metallization path 224 includes metal interconnects 228 that extend through vias 222 and electrically couple with contact pads 176, 180, and metal interconnects 230 that extend through vias 222 and electrically couple with contact pads 178, 182, 214. Metallization paths 224 may comprise a layer of copper, and may be formed using a sputtering and plating technique, followed by a lithography process.

Following formation of POL interconnect layer 166 or POL interconnect layer 208, support structure 174 and any shims 192 may be removed if desired. Each resulting POL assembly 232, 234 may then be sawn or singulated into individual POL structures having one or multiple semiconductor devices. Where a resulting POL structure includes multiple semiconductor dies, the portion of the dielectric layer 200, 210 residing within gap 206 may be removed, such as by laser ablation, or retained to provide additional structural rigidity to the POL structure. Wirebonds may be coupled to metal interconnects 228, 230 in a similar manner as described with respect to any of FIGS. 7-11 either prior to singulation or after.

Figure 14:
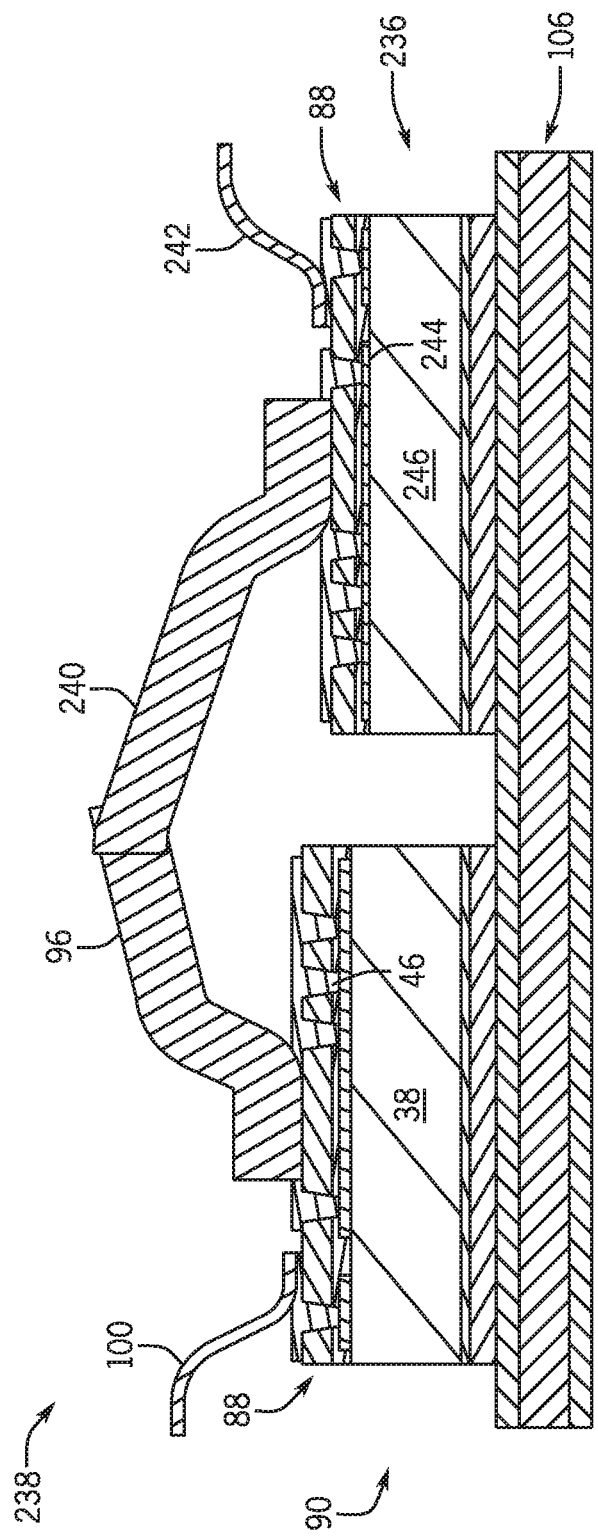
FIG. 14 is a schematic cross-sectional side view of a POL assembly, according to an embodiment of the invention.

Now referring to FIG. 14, a singulated POL structure 90 is shown electrically coupled with another POL structure 236 within a POL assembly 238, in accordance with another embodiment of the invention. As shown, each POL structure 90, 236 includes a respective POL interconnect layer 88 to which wirebonds 96, 100, 240, 242 of respective POL structures 90, 236 are coupled. Wirebonds 96, 240 electrically couple contact pad 46 of semiconductor device 38 with a contact pad 244 of semiconductor device 246. While FIG. 14 shows POL structures 90, 236 as having different heights, it is contemplated that POL structures 90, 236 may have the same height.

In one embodiment POL structures 90, 236 are thermally coupled to the same multilayer substrate 106, as shown in FIG. 14. However, one having ordinary skill in the art would recognize that POL structures 90, 236 may be thermally coupled to separate multilayer substrates 106. In addition, it is contemplated that multilayer substrate 106 may be a DBC substrate or a DBA substrate in alternative embodiments.

Figure 15:
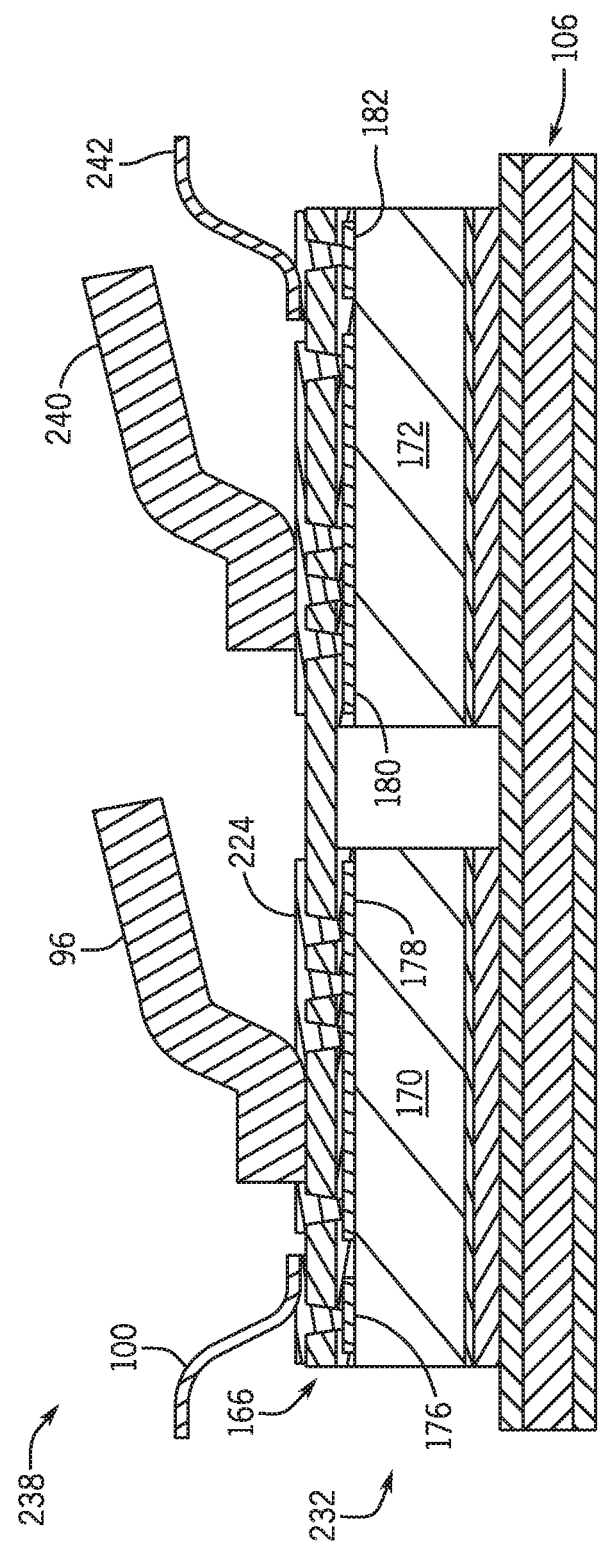
FIG. 15 is a schematic cross-sectional side view of a POL assembly, according to another embodiment of the invention.

Next, FIG. 15 shows an alternative embodiment of a POL assembly 238 in which the singulated POL structures 90, 236 described with respect to FIG. 14 are replaced with reconstituted wafer 232 having at least two semiconductor devices 170, 172. As shown, POL interconnect layer 166 is formed across the upward-facing surfaces of both semiconductor devices 170, 172 and spans the gap between semiconductor devices 170, 172. While FIG. 15 depicts semiconductor devices 170, 172 as being thermally coupled to the same multilayer substrate 106, it is contemplated that each semiconductor device 170, 172 may be coupled to its own separate multilayer substrate 106.

Wirebonds 96, 100, 240, 242 are coupled to the POL interconnect layer 166. In this embodiment, metallization path 224 electrically connects contact pads 176, 178, 180, 182 of semiconductor devices 170, 172 of POL assembly 238. As a result, semiconductor devices 170, 172 may be electrically coupled to one another without a direct connection between wirebonds 96, 240. Wirebonds 96, 240 may thus be used to electrically couple POL assembly 238 to other POL assemblies.

Beneficially, embodiments of the present invention provide a POL structure that allows copper wirebonding regardless of the material of the contact pads of the semiconductor device. The POL interconnect layer provides a copper metallization path that is electrically connected to the contact pads of the semiconductor device and that forms a contact surface to which copper wirebonds may be reliably attached. This permits the use of copper wirebonds in POL modules that include different types of power devices that have different metallization layers, such as copper and aluminum contact pads, for example.

The resulting POL structure also provides more efficient current distribution from the semiconductor power device to the wirebonds than prior art structures. The metalized interconnect structure provided within the POL interconnect layer provides parallel paths for the current to travel from the thin metallization of the contact pads of the power device before entering the wirebonds.

Also, the thickness of the POL interconnect layer forms a protective buffer layer between the wirebonds and the power device that protects the power device from the higher energies associated with copper-to-copper wirebonding as compared to aluminum-to-aluminum wirebonding. Because the POL interconnect layer acts as a stress buffer for the power device during the wirebonding process, wirebonds having a heavier gauge than those used for traditional copper-to-copper wirebonding may be electrically coupled to the power device without risk of damage to the device. These heavier gauge wirebonds further reduce the interconnect resistance, and hence the associated losses, between the power device and wirebonds.

Therefore, according to one embodiment of the invention, a power overlay (POL) structure includes a power device having at least one upper contact pad disposed on an upper surface of the power device, and a POL interconnect layer having a dielectric layer coupled to the upper surface of the power device and a metallization layer having metal interconnects extending through vias formed through the dielectric layer and electrically coupled to the at least one upper contact pad of the power device. The POL structure also includes at least one copper wirebond directly coupled to the metallization layer.

According to another aspect of the invention, a method of manufacturing a POL structure includes providing a wafer comprising a plurality of semiconductor devices, coupling a dielectric layer to an upper surface of the each of the plurality of semiconductor devices, forming a plurality of vias through the dielectric layer to expose at least one contact pad of the plurality of semiconductor devices, and forming a metallization layer on an upper surface f the dielectric layer, the metallization layer having metal interconnects that extend through the plurality of vias and electrically couple with the at least one contact pad of the plurality of semiconductor devices. The method further includes coupling at least one wirebond to a top surface of the metallization layer.

According to yet another aspect of the invention, a POL assembly includes a first semiconductor device, a second semiconductor device, and a POL interconnect assembly having a polymide film adhesively coupled to upper contact pads of the first and second semiconductor devices and a metallization path formed on the polymide film, the metallization path comprising a plurality of metal interconnects extending through vias formed through the polymide film and electrically coupled to the upper contact pads of the first and second semiconductor devices. The POL assembly also includes a plurality of copper wirebonds directly coupled to the metallization path, wherein a first wirebond of the plurality of copper wirebonds is electrically coupled to an upper contact pad of the first semiconductor device, and wherein a second wirebond of the plurality of copper wirebonds is electrically coupled to an upper contact pad of the second semiconductor device.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electrical package comprising:
a semiconductor device having at least one contact pad positioned on a first surface thereof;
a dielectric layer having a bottom surface coupled to the first surface of the semiconductor device;
a metallization layer comprising a plurality of conductive vias extending through the dielectric layer to electrically couple with the at least one contact pad, wherein a portion of the metallization layer is atop a top surface of the dielectric layer; and
a first wirebond positioned on a top surface of the metallization layer, the first wirebond electrically coupled to a first contact pad of the at least one contact pad by way of at least two conductive vias of the plurality of conductive vias;
wherein a conductive via of the plurality of conductive vias spans a thickness defined between the top surface of the dielectric layer and the at least one contact pad.

2. The electrical package of claim 1 wherein the at least one contact pad and the first wirebond comprise dissimilar materials.

3. The electrical package of claim 1 further comprising a second wirebond positioned on the top surface of the metallization layer, the second wirebond electrically coupled to a second contact pad of the at least one contact pad by way of only one conductive via of the plurality of conductive vias.

4. The electrical package of claim 3 wherein the first wirebond comprises a heavier gauge wire than the second wirebond.

5. The electrical package of claim 1 wherein the semiconductor device comprises one of a transistor, a thyristor, and a diode.

6. An electrical package comprising:
a dielectric layer;
a metallization path formed on a top surface of the dielectric layer, the metallization path comprising a first portion extending into a well formed within the dielectric layer;
a semiconductor device coupled to a bottom surface of the dielectric layer such that a first contact pad of the semiconductor device is positioned below the well; and
a first wirebond positioned within the well and electrically coupled to the first contact pad.

7. The electrical package of claim 6 wherein a bottom surface of the first wirebond is positioned below the top surface of the dielectric layer.

8. The electrical package of claim 7 wherein the bottom surface of the first wirebond is positioned entirely within the well.

9. The electrical package of claim 6 further comprising a second wirebond coupled to a second portion of the metallization path and a second contact pad of the semiconductor device.

10. The electrical package of claim 9 wherein a bottom surface of the second wirebond is positioned above the top surface of the dielectric layer; and
wherein the bottom surface of the first wirebond is positioned below the top surface of the dielectric layer.

11. The electrical package of claim 9 wherein the first wirebond is constructed of a heavier gauge wire than the second wirebond.

12. An electrical package comprising:
a semiconductor device;
an interconnect layer formed atop the semiconductor device, the interconnect layer comprising:
a dielectric layer; and
a metallization layer comprising a plurality of metalized vias extending through a thickness of the dielectric layer to contact a first contact pad of the semiconductor device; and
a first wirebond electrically coupled to the first contact pad of the semiconductor device, the first wirebond located atop a portion of the interconnect layer that is free of the plurality of metalized vias between a contact surface of the first wirebond and the first contact pad of the semiconductor device.

13. The electrical package of claim 12 wherein the plurality of metalized vias create parallel current paths between the first wirebond and the first contact pad of the semiconductor device.

14. The electrical package of claim 12 wherein the dielectric layer has a substantially uniform thickness within the portion of the interconnect layer that is free of the plurality of metalized vias.

15. A reconstituted semiconductor wafer comprising:
an electrical interconnect structure comprising:
a dielectric layer; and
a plurality of metal interconnects that extend through vias formed in the dielectric layer;
a first semiconductor device coupled to a bottom surface of the dielectric layer, the first semiconductor device comprising at least a first contact pad electrically coupled to at least two metal interconnects of the plurality of metal interconnects;
a first wirebond electrically coupled to the first semiconductor device;
a second semiconductor device coupled to the bottom surface of the dielectric layer, the second semiconductor device comprising at least one contact pad electrically coupled to at least one metal interconnect of the plurality of metal interconnects; and
a second wirebond electrically coupled to the second semiconductor device;
wherein the at least two metal interconnects are in contact with the first contact pad.

16. The reconstituted semiconductor wafer of claim 15 wherein a portion of the electrical interconnect structure spans a gap between the first semiconductor device and the second semiconductor device.

17. The reconstituted semiconductor wafer of claim 15 wherein the second wirebond is coupled to the second semiconductor device by at least two metal interconnects of the plurality of metal interconnects.

18. The reconstituted semiconductor wafer of claim 15 further comprising a common support structure coupled to a bottom surface of the first semiconductor device and a bottom surface of the second semiconductor device.

19. The reconstituted semiconductor wafer of claim 18 wherein the common support structure comprises a multilayer structure electrically coupled to a lower contact pad of the first semiconductor device and a lower contact pad of the second semiconductor device.

20. The reconstituted semiconductor wafer of claim 15 wherein the second semiconductor device is thinner than the first semiconductor device.

21. The reconstituted semiconductor wafer of claim 20 wherein a portion of the dielectric layer coupled to the first semiconductor device has a first thickness and a portion of the dielectric layer coupled to the second semiconductor device has a second thickness, greater than the first thickness.

22. An electrical package comprising:
    a semiconductor device having at least a first contact pad positioned on an active surface thereof; and
    an interconnect layer comprising:
        a dielectric layer having a bottom surface coupled to the active surface of the semiconductor device;
        a metallization layer atop a top surface of the dielectric layer; and
        a plurality of metal interconnects extending from the metallization layer and through the dielectric layer to contact the first contact pad.

23. The electrical package of claim 22 wherein the active surface of the semiconductor device includes the first contact pad and a second contact pad; and
    wherein the interconnect layer further comprises another metal interconnect extending from the metallization layer and through the dielectric layer to contact the second contact pad.

24. The electrical package of claim 23 further comprising:
    a first wirebond electrically coupled to the first contact pad through the plurality of metal interconnects; and
    a second wirebond electrically coupled to the second contact pad through another metal interconnect extending from the metallization layer;
    wherein the second wirebond comprises a thinner gauge wire than the first wirebond.

25. The electrical package of claim 22 further comprising a wirebond atop the metallization layer, the wirebond electrically coupled to the first contact pad through the plurality of metal interconnects.

26. The electrical package of claim 25 wherein a surface of the wirebond that contacts the metallization layer is positioned directly above at least two metal interconnects of the plurality of metal interconnects.

27. The electrical package of claim 25 wherein the wirebond is positioned such that no metal interconnects of the plurality of metal interconnects are located in a region defined between a contact surface of the wirebond and the first contact pad.

28. The electrical package of claim 22 wherein the semiconductor device and the interconnect layer are substantially equal in width.

* * * * *